US012742242B2

(12) United States Patent
Kajbafvala et al.

(10) Patent No.: US 12,742,242 B2
(45) Date of Patent: Sep. 22, 2026

(54) METHODS OF FORMING STRUCTURES, SEMICONDUCTOR PROCESSING SYSTEMS, AND SEMICONDUCTOR DEVICE STRUCTURES

(71) Applicant: ASM IP Holding B.V., Almere (NL)

(72) Inventors: Amir Kajbafvala, Chandler, AZ (US); Yanfu Lu, Phoenix, AZ (US); Robinson James, Phoenix, AZ (US); Caleb Miskin, Mesa, AZ (US)

(73) Assignee: ASM IP Holding B.V., Almere (NL)

( * ) Notice: Subject to any disclaimer, the term of this patent is extended or adjusted under 35 U.S.C. 154(b) by 276 days.

(21) Appl. No.: 18/598,172

(22) Filed: Mar. 7, 2024

(65) Prior Publication Data

US 2024/0209510 A1 Jun. 27, 2024

Related U.S. Application Data

(62) Division of application No. 17/697,079, filed on Mar. 17, 2022, now Pat. No. 11,959,173.

(Continued)

(51) Int. Cl.

| | |
|---|---|
| ***C23C 16/00*** | (2006.01) |
| ***C23C 16/24*** | (2006.01) |
| ***C23C 16/30*** | (2006.01) |
| ***C23C 16/46*** | (2006.01) |
| ***C23C 16/48*** | (2006.01) |

(Continued)

(52) U.S. Cl.

CPC ............ *C23C 16/482* (2013.01); *C23C 16/24* (2013.01); *C23C 16/30* (2013.01); *C23C 16/46* (2013.01); *C23C 16/52* (2013.01); *G01J 5/0007* (2013.01); *G01K 7/10* (2013.01); *H01J 37/32321* (2013.01); *H01J 37/32724* (2013.01); *H01J 37/32935* (2013.01); *H10D 30/024* (2025.01); *H10D 30/031* (2025.01); *H10D 30/6735* (2025.01); *H10D 30/6757* (2025.01)

(58) Field of Classification Search

CPC ....... C23C 16/482; C23C 16/24; C23C 16/30; C23C 16/52; C23C 16/46; H01J 37/32321; H01J 37/32724; H01J 37/32935; H01J 37/32522; H01J 37/32715; H01J 37/3299

See application file for complete search history.

(56) References Cited

U.S. PATENT DOCUMENTS

| | | | |
|---|---|---|---|
| 4,749,440 | A | 6/1988 | Blackwood et al. |
| 4,997,490 | A | 3/1991 | Vetter et al. |

(Continued)

FOREIGN PATENT DOCUMENTS

| | | | |
|---|---|---|---|
| CN | 102191485 | A | 9/2011 |
| CN | 103308182 | A | 9/2013 |

(Continued)

*Primary Examiner* — Luz L Alejandro Mulero

(74) *Attorney, Agent, or Firm* — Snell & Wilmer L.L.P.

(57) ABSTRACT

A method of forming structure includes providing a substrate in a reaction chamber, forming a first layer overlaying the substrate, and forming a second layer onto the first layer. Temperature of the first layer is controlled during the forming of the first layer using infrared electromagnetic radiation emitted by the first layer. Temperature of the second layer is controlled during the forming of the second layer using infrared electromagnetic radiation emitted by the second layer. Semiconductor device structures and semiconductor processing systems are also described.

20 Claims, 9 Drawing Sheets

Related U.S. Application Data

(60) Provisional application No. 63/178,749, filed on Apr. 23, 2021, provisional application No. 63/162,878, filed on Mar. 18, 2021.

(51) Int. Cl.

| | |
|---|---|
| ***C23C 16/52*** | (2006.01) |
| ***G01J 5/00*** | (2022.01) |
| ***G01K 7/10*** | (2006.01) |
| ***H01J 37/32*** | (2006.01) |
| *H10D 30/01* | (2025.01) |
| *H10D 30/67* | (2025.01) |

(56) References Cited

U.S. PATENT DOCUMENTS

| | | | | |
|---|---|---|---|---|
| 5,155,336 | A | 10/1992 | Gronet | |
| 5,231,595 | A | 7/1993 | Makino et al. | |
| 5,305,417 | A | 4/1994 | Najm et al. | |
| 5,785,820 | A | 7/1998 | Hoffman et al. | |
| 5,928,426 | A | 7/1999 | Aitchison | |
| 6,065,481 | A | 5/2000 | Fayfield et al. | |
| 6,079,874 | A * | 6/2000 | Hegedus | H10P 72/0602 118/725 |
| 6,092,539 | A | 7/2000 | Chang et al. | |
| 6,215,106 | B1 * | 4/2001 | Boas | C23C 16/45508 118/724 |
| 6,221,168 | B1 | 4/2001 | Carter et al. | |
| 6,277,204 | B1 | 8/2001 | Chang et al. | |
| 6,348,420 | B1 | 2/2002 | Raaijmakers et al. | |
| 6,492,625 | B1 * | 12/2002 | Boguslavskiy | G01J 5/0022 219/486 |
| 6,631,788 | B2 | 10/2003 | Shikai et al. | |
| 6,640,604 | B2 | 11/2003 | Matsushita | |
| 6,799,137 | B2 * | 9/2004 | Schietinger | G01J 5/0003 374/E11.003 |
| 7,198,997 | B2 | 4/2007 | Shiono et al. | |
| 7,543,981 | B2 | 6/2009 | Timans | |
| 8,283,607 | B2 | 10/2012 | Ranish et al. | |
| 9,031,685 | B2 * | 5/2015 | Chin | C23C 16/45548 700/121 |
| 9,034,770 | B2 | 5/2015 | Park et al. | |
| 9,093,269 | B2 | 7/2015 | Cody et al. | |
| 9,093,390 | B2 | 7/2015 | Wang et al. | |
| 9,299,557 | B2 | 3/2016 | Tolle et al. | |
| 9,474,163 | B2 | 10/2016 | Tolle et al. | |
| 9,514,927 | B2 | 12/2016 | Tolle et al. | |
| 9,570,298 | B1 | 2/2017 | Basker et al. | |
| 9,576,788 | B2 | 2/2017 | Liu et al. | |
| 9,683,308 | B2 | 6/2017 | Olsen et al. | |
| 9,870,921 | B2 | 1/2018 | Olsen et al. | |
| 9,887,096 | B2 | 2/2018 | Park et al. | |
| 10,153,172 | B2 | 12/2018 | Sako | |
| 10,373,850 | B2 | 8/2019 | Tolle et al. | |
| 10,519,541 | B2 | 12/2019 | Tolle et al. | |
| 10,861,693 | B2 | 12/2020 | Stone et al. | |
| 12,112,938 | B2 | 10/2024 | Wei et al. | |
| 2001/0051128 | A1 | 12/2001 | Hoffman et al. | |
| 2002/0062845 | A1 | 5/2002 | Kawai et al. | |
| 2003/0119283 | A1 | 6/2003 | Ishibashi et al. | |
| 2005/0126030 | A1 | 6/2005 | Ohmi et al. | |
| 2006/0004493 | A1 | 1/2006 | Hwang et al. | |
| 2006/0112974 | A1 | 6/2006 | Isago et al. | |
| 2007/0015360 | A1 | 1/2007 | Lu et al. | |
| 2009/0101633 | A1 | 4/2009 | Aggarwal et al. | |
| 2010/0133257 | A1 | 6/2010 | Sorabji et al. | |
| 2011/0149062 | A1 | 6/2011 | Campidell et al. | |
| 2011/0266252 | A1 | 11/2011 | Thandani et al. | |
| 2013/0130184 | A1 | 5/2013 | Lu et al. | |
| 2013/0171350 | A1 | 7/2013 | Kraus et al. | |
| 2014/0030859 | A1 | 1/2014 | Xie et al. | |
| 2015/0184313 | A1 | 7/2015 | Yoshitake et al. | |
| 2016/0027671 | A1 | 1/2016 | Ranish et al. | |
| 2016/0027674 | A1 | 1/2016 | Griffin et al. | |
| 2016/0133504 | A1 * | 5/2016 | Chu | H10P 72/7611 165/146 |
| 2016/0307771 | A1 | 10/2016 | Xu et al. | |
| 2017/0074727 | A1 | 3/2017 | Liu et al. | |
| 2017/0101712 | A1 | 4/2017 | Bansal et al. | |
| 2017/0170014 | A1 | 6/2017 | Basker et al. | |
| 2017/0178917 | A1 | 6/2017 | Kamp et al. | |
| 2017/0194430 | A1 | 7/2017 | Wood et al. | |
| 2018/0182597 | A1 | 6/2018 | Blomberg et al. | |
| 2018/0350619 | A1 | 12/2018 | Chen et al. | |
| 2019/0027605 | A1 | 1/2019 | Tolle et al. | |
| 2019/0112709 | A1 | 4/2019 | Arkles et al. | |
| 2019/0123174 | A1 | 4/2019 | Mochizuki et al. | |
| 2019/0127851 | A1 * | 5/2019 | Lau | B23K 26/0006 |
| 2019/0221458 | A1 | 7/2019 | Lu et al. | |
| 2019/0333793 | A1 | 10/2019 | Tolle et al. | |
| 2019/0348261 | A1 | 11/2019 | Lin et al. | |
| 2020/0080894 | A1 | 3/2020 | Leow et al. | |
| 2020/0118336 | A1 | 4/2020 | Oyanagi et al. | |
| 2020/0118836 | A1 | 4/2020 | Ding et al. | |
| 2020/0234968 | A1 | 7/2020 | Zhang et al. | |
| 2020/0294794 | A1 | 9/2020 | Haberecht et al. | |
| 2021/0125853 | A1 | 4/2021 | Rathi et al. | |
| 2021/0257260 | A1 | 8/2021 | Chu et al. | |
| 2021/0366722 | A1 | 11/2021 | Lei et al. | |
| 2022/0130668 | A1 * | 4/2022 | Tolle | C23C 16/4405 |
| 2022/0298643 | A1 | 9/2022 | Kajbafvala et al. | |
| 2022/0301856 | A1 | 9/2022 | Wei et al. | |
| 2022/0386417 | A1 | 12/2022 | Taniguchi | |
| 2024/0429038 | A1 | 12/2024 | Wei et al. | |

FOREIGN PATENT DOCUMENTS

| | | | |
|---|---|---|---|
| CN | 106637145 | A | 5/2017 |
| JP | H06104252 | A | 4/1994 |
| JP | 2010062197 | A | 3/2010 |
| JP | 2011187637 | A | 9/2011 |
| KR | 20140105974 | A | 9/2014 |
| TW | 201415541 | A | 4/2014 |
| WO | 2013176453 | A1 | 11/2013 |
| WO | 2013192510 | A1 | 12/2013 |

* cited by examiner 26
114
112
10
32
20
H
14
H
108
128

26
114
112
32
20
H
14
H
108
128

28
114
112
12
22
34
H
20
14
H
108
128

METHODS OF FORMING STRUCTURES, SEMICONDUCTOR PROCESSING SYSTEMS, AND SEMICONDUCTOR DEVICE STRUCTURES

CROSS-REFERENCE TO RELATED APPLICATIONS

This application is a divisional of, and claims priority to and the benefit of, U.S. patent application Ser. No. 17/697,079, filed Mar. 17, 2022 and entitled "METHODS OF FORMING STRUCTURES, SEMICONDUCTOR PROCESSING SYSTEMS, AND SEMICONDUCTOR DEVICE STRUCTURES," which claims priority to and the benefit of U.S. Provisional Patent Application No. 63/162,878, filed Mar. 18, 2021 and entitled "FILM DEPOSITION SYSTEMS AND METHODS," and U.S. Provisional Patent Application No. 63/178,749, filed Apr. 23, 2021 and entitled "METHODS OF FORMING STRUCTURES, SEMICONDUCTOR PROCESSING SYSTEMS, AND SEMICONDUCTOR DEVICE STRUCTURES," which are hereby incorporated by reference herein to the extent that they do not conflict with the present disclosure.

FIELD OF INVENTION

The present disclosure generally relates to forming structures. More particularly, the present disclosure relates to forming semiconductor device structures overlaying substrates using semiconductor processing systems.

BACKGROUND OF THE DISCLOSURE

Semiconductor devices, such transistors, are commonly formed by depositing films onto substrates. Deposition is generally accomplished by supporting a substrate within a reactor using a substrate holder, exposing the substrate to a precursor, and heating the substrate to temperature selected to cause a film to deposit on the substrate. The temperature of the substrate is typically controlled during deposition to control deposition rate, thickness, and/or uniformity. The substrate thereafter typically undergoes further processing (e.g., polishing, patterning, etching, etc.) to form various features required in a desired semiconductor device.

In some film deposition operations, temperature of the substrate may be controlled by a thermocouple or thermocouple array. The thermocouple (or thermocouple array) is generally located within the reactor and in proximity to the substrate holder, and may be thermally coupled to the substrate by intervening structure(s) such as the substrate holder, static structure proximate the substrate holder, and/or gaps defined between the substrate holder and the static structure. The thermal coupling causes temperature change in the substrate to be telegraphed to the thermocouple through the intervening structures, typically according to factors such as temperature differential and thermal coefficient of materials forming the intervening structure. The thermocouple in turn reports the temperature change and the heating of the substrate is adjusted in response to the reported temperature, as appropriate.

While such thermocouples and thermocouple arrays are generally satisfactory for their intended purpose, such devices generally provide an indirect mechanism for temperature control. In this respect, there may be a delay between when temperature of the substrate changes and when the thermocouple or thermocouple array appreciates that the substrate temperature has changed. The delay allows the actual temperature to deviate from the desired deposition temperature, potentially inducing variation in the film thickness. And while the resulting thickness variation is generally small in relatively thick films, the variation may be relatively large in deposition operations where the deposited film is relatively thin, such as in films deposited to from nanosheet stacks the fabrication of semiconductor devices having three-dimensional architectures, like finFET and gate-all-around transistor devices.

Such systems and methods have generally been satisfactory for their intended purpose. However, there remains a need for improved methods of forming structures, and semiconductor processing systems for forming structures, and semiconductor device structures. The present solution provides a solution to this need.

SUMMARY OF THE DISCLOSURE

A method of forming a structure is provided. The method includes providing a substrate in a reaction chamber, forming a first layer overlaying the substrate, and forming a second layer onto the first layer. Temperature of the first layer is controlled during the forming of the first layer using infrared electromagnetic radiation emitted by the first layer. Temperature of the second layer is controlled during the forming of the second layer using infrared electromagnetic radiation emitted by the second layer.

In addition to one or more of the features described above, or as an alternative, further examples of the method may include providing the substrate in the reaction chamber may include optically coupling a pyrometer to a surface of the substrate. Providing the substrate in the reaction chamber may include radiantly coupling a heater element to the surface of substrate. The pyrometer may be operatively associated with the heater element to control temperature of the first layer and the second layer during forming of the first layer and the second layer.

In addition to one or more of the features described above, or as an alternative, further examples of the method may include that controlling temperature of the first layer during the forming of the first layer includes receiving infrared electromagnetic radiation emitted by the first layer at a pyrometer and determining a first layer temperature using the infrared electromagnetic radiation received from the first layer at the pyrometer. The first layer temperature is compared to a predetermined first layer temperature limit, and heating of the first layer is increased or decreased when the first layer temperature is outside of the predetermined first layer formation temperature limit.

In addition to one or more of the features described above, or as an alternative, further examples of the method may include that controlling temperature of the second layer during the forming of the second layer includes receiving infrared electromagnetic radiation emitted by the second layer at a pyrometer and determining a second layer temperature using the infrared electromagnetic radiation received from the second layer at the pyrometer. The second layer temperature is compared to a predetermined second layer temperature limit, and heating of the second layer is increased or decreased when the second layer temperature is outside of the predetermined second layer formation temperature limit.

In addition to one or more of the features described above, or as an alternative, further examples of the method may include thermally conditioning the substrate prior to forming the first layer on the substrate.

In addition to one or more of the features described above, or as an alternative, further examples of the method may include that thermally conditioning the substrate comprises receiving infrared electromagnetic radiation emitted by the substrate at a pyrometer, determining a substrate surface temperature using the infrared electromagnetic radiation received from the substrate surface at the pyrometer, comparing the substrate surface temperature to a predetermined first layer formation temperature limit, and increasing or decreasing heating of the substrate when the substrate surface temperature is outside of the predetermined first layer formation temperature limit. Forming of the first layer overlaying the substrate may begin when the substrate surface temperature is within the predetermined first layer formation temperature limit.

In addition to one or more of the features described above, or as an alternative, further examples of the method may include that thermally conditioning the first layer prior to forming the second layer onto the first layer comprises infrared electromagnetic radiation emitted by the first layer at a pyrometer, determining a first layer temperature using the infrared electromagnetic radiation received from the first layer at the pyrometer, and comparing the first layer temperature to a predetermined second layer formation temperature limit. Heating of the first layer may be increased or decreased when the first layer temperature is outside of the predetermined second layer formation temperature limit and formation of the second layer onto the first layer started when the first layer surface temperature is within the predetermined second layer formation temperature limit.

In addition to one or more of the features described above, or as an alternative, further examples of the method may include that forming the first layer comprises providing a first layer precursor to the reaction chamber comprising one or more of dichlorosilane ($H_2SiCl_2$), silane ($SiH_4$), hydrochloric acid (HCl), and germane ($GeH_4$).

In addition to one or more of the features described above, or as an alternative, further examples of the method may include that forming the first layer comprises maintaining a first layer formation pressure within the reaction chamber between about 2 torr and about 80 torr, or between about 4 torr and about 60 torr, or between about 5 torr and about 40 torr.

In addition to one or more of the features described above, or as an alternative, further examples of the method may include that forming the first layer comprises maintaining the first within a predetermined first layer formation temperature limit between about 500° C. and about 750° C., or between about 600° C. and about 700° C., or between about 620° C. and about 680° C.

In addition to one or more of the features described above, or as an alternative, further examples of the method may include that forming the first layer comprises a first layer formation interval between about 10 seconds and about 50 seconds, or between about 10 seconds and about 40 seconds, or between about 16 seconds and about 26 seconds.

In addition to one or more of the features described above, or as an alternative, further examples of the method may include that forming the second layer comprises providing a second layer precursor to the reaction chamber comprising one or more of silane ($SiH_4$), dichlorosilane ($H_2SiCl_2$), disilane ($Si_2H_6$), and trisilane ($Si_3H_8$).

In addition to one or more of the features described above, or as an alternative, further examples of the method may include that forming the second layer comprises maintaining a second layer formation pressure within the reaction chamber between about 2 torr and about 80 torr, or between about 4 torr and about 60 torr, or between about 5 torr and about 40 torr.

In addition to one or more of the features described above, or as an alternative, further examples of the method may include that forming the second layer comprises maintaining the second layer at a predetermined second layer formation temperature between about 600° C. and about 800° C., or between about 600° C. and about 750° ° C., or between about 640° C. and about 700° C.

In addition to one or more of the features described above, or as an alternative, further examples of the method may include that forming the second layer comprises a second layer formation interval that is between about 10 seconds and about 50 seconds, or between about 14 seconds and about 40 seconds, or between about 16 seconds and about 26 seconds.

In addition to one or more of the features described above, or as an alternative, further examples of the method may include that the first layer and the second layer form a first layer pair, the method further comprising forming at least one second layer pair onto the first layer pair with a third layer and fourth layer, the third layer formed onto the second layer and identical to the first layer, the fourth layer formed onto the third layer and identical to the second layer.

A semiconductor processing system is also provided. The semiconductor processing system includes a reaction chamber configured for forming a structure on a substrate, a pyrometer optically coupled to the substrate, a heater element radiantly coupled to the substrate; and a controller. The controller is disposed in communication with the pyrometer and is operatively connected to the heater element. The controller is responsive to instructions recorded on a non-transitory machine-readable memory to perform certain operations including form a first layer overlying the substrate, control temperature of the substrate using infrared electromagnetic radiation emitted by the first layer during the forming of the first layer, form a second layer onto the first layer, and control temperature of the substrate using infrared electromagnetic radiation emitted by the second layer during the forming of the second layer.

In addition to one or more of the features described above, or as an alternative, further examples of the system may include that the instructions further cause the controller to determine a first layer temperature using the infrared electromagnetic radiation received from the first layer at the pyrometer, compare the first layer temperature to a predetermined first layer temperature limit; and increase or decrease heating of the first layer when the first layer temperature is outside of the predetermined first layer formation temperature limit.

In addition to one or more of the features described above, or as an alternative, further examples of the system may include the instructions further cause the controller to determine a second layer temperature using the infrared electromagnetic radiation received from the second layer at the pyrometer, compare the second layer temperature to a predetermined second layer temperature limit, and increase or decrease heating of the second layer when the second layer temperature is outside of the predetermined second layer formation temperature limit.

In addition to one or more of the features described above, or as an alternative, further examples of the system may include that the pyrometer is optically coupled to the first layer during the forming of the first layer, that the pyrometer is optically coupled to the second layer during the forming of the second layer, and that the system further includes a thermocouple arranged on side of the substrate opposite the pyrometer.

A semiconductor device structure having a finFET or a gate-all-around architecture is provided. The semiconductor device structure is formed using the method as described above.

In addition to one or more of the features described above, or as an alternative, further examples of the semiconductor device structure may include that the semiconductor device structure is a nanosheet stack.

In addition to one or more of the features described above, or as an alternative, further examples of the semiconductor device structure may include that the semiconductor device structure has a plurality of layer pairs having thicknesses that are between about 50 nanometers and 5 nanometers.

In addition to one or more of the features described above, or as an alternative, further examples may include that the semiconductor device structure has a silicon-germanium layer overlaying the substrate and a silicon layer formed onto the silicon-germanium layer.

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

BRIEF DESCRIPTION OF THE DRAWING FIGURES

These and other features, aspects, and advantages of the invention disclosed herein are described below with reference to the drawings of certain embodiments, which are intended to illustrate and not to limit the invention.

Figure 6:
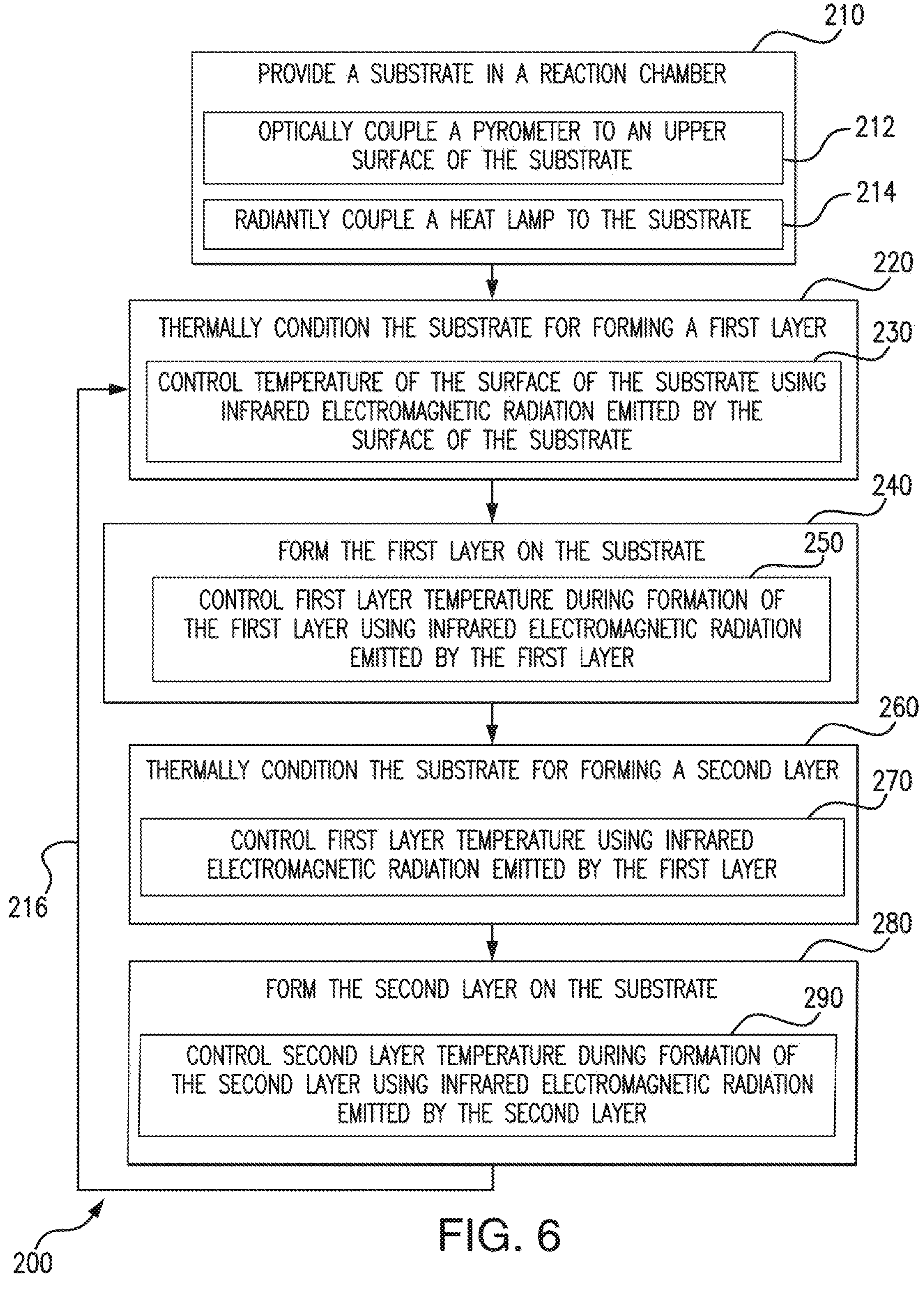
FIG. 6 is a block diagram of a method of forming a structure according to the present disclosure, showing operations of the method according to an illustrative and non-limiting example of the method.
Figure 11:
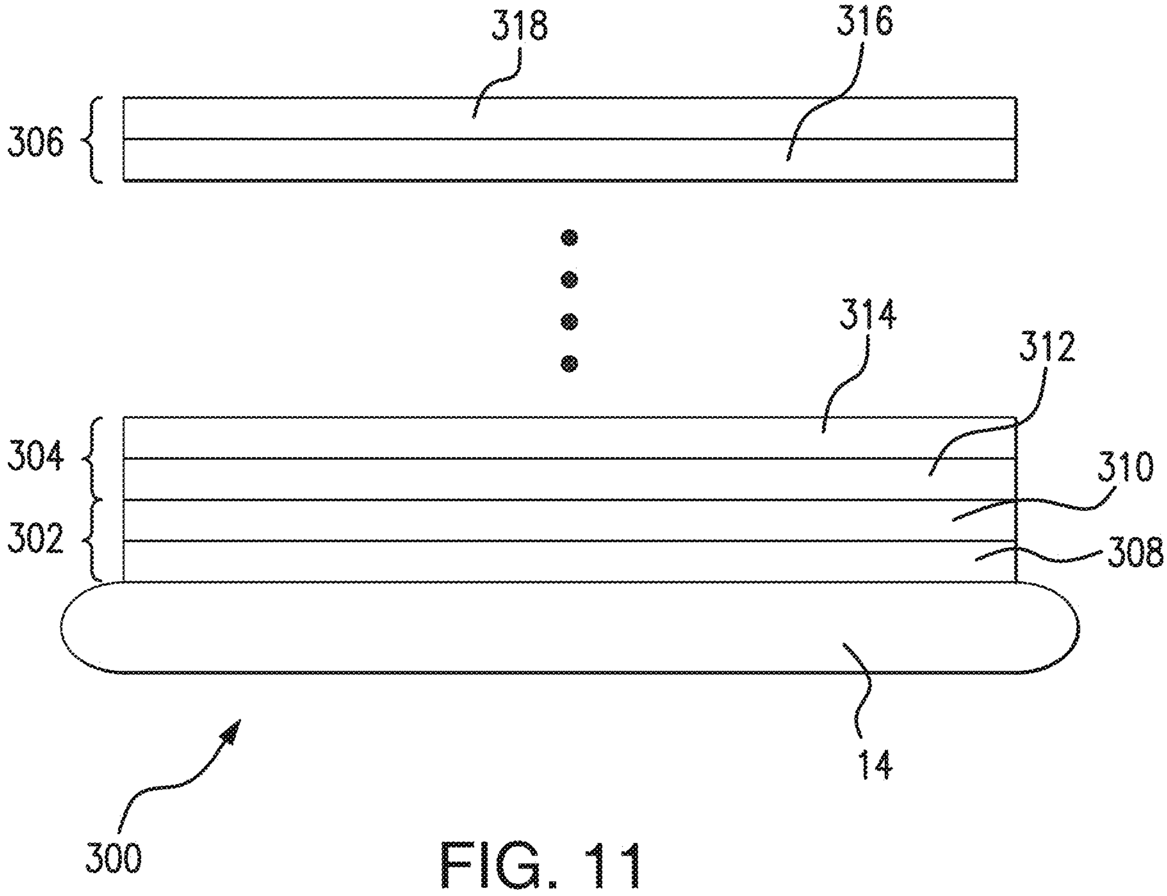
Figure 12:
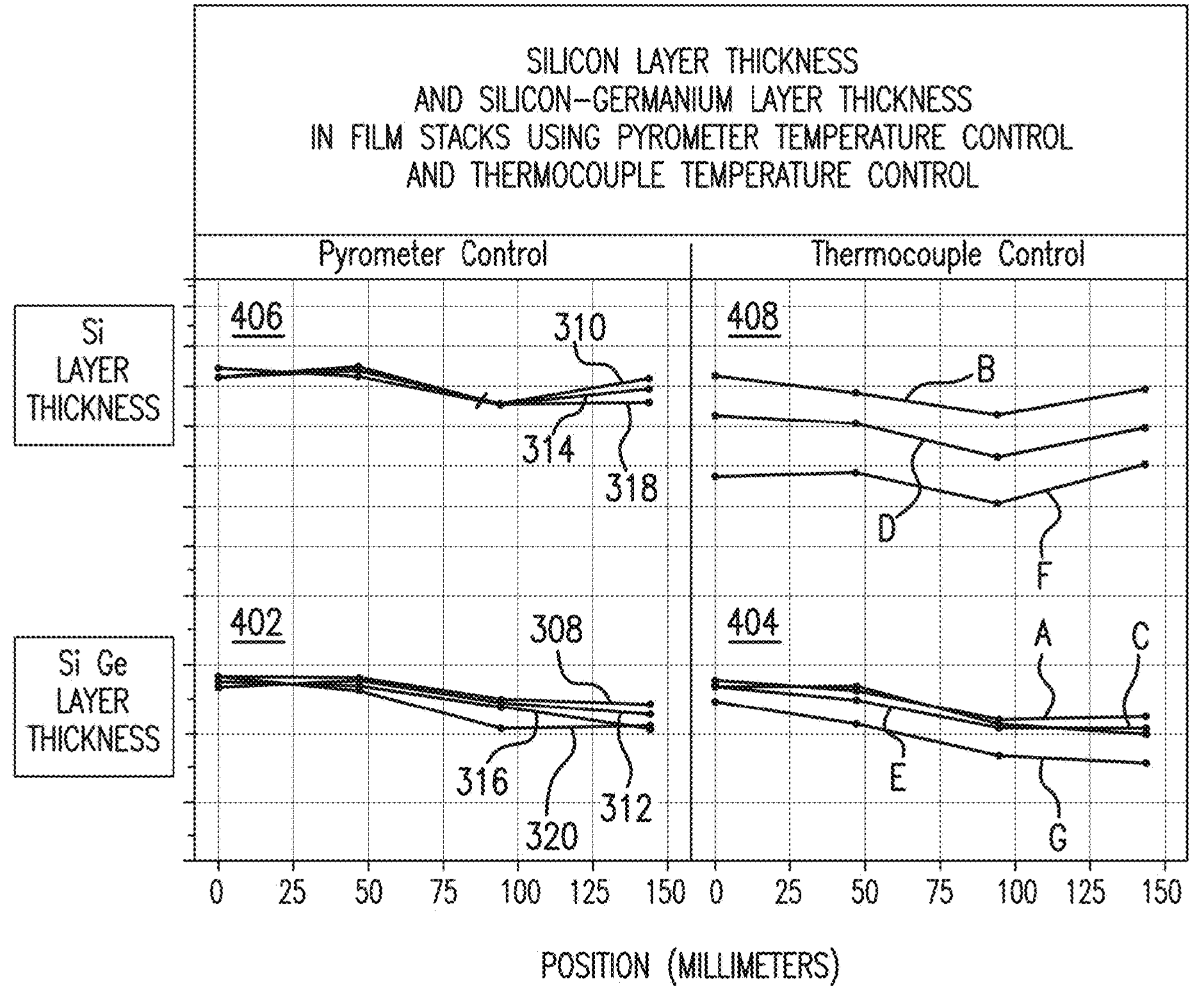

FIG. 11 is a schematic view of a structure formed using method of FIG. 6, showing a nanosheet film stack for semiconductor device structure having a fin field-effect transistor (FinFET) or gate-all-around (GAA) architecture overlaying a substrate; and FIG. 12 is a comparison of thickness variation in nanosheet film stacks formed with alternating silicon-germanium and silicon layers, showing lower layer-to-layer thickness variation in film stacks formed using pyrometer temperature and thermocouple temperature control.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Figures 1, 2:
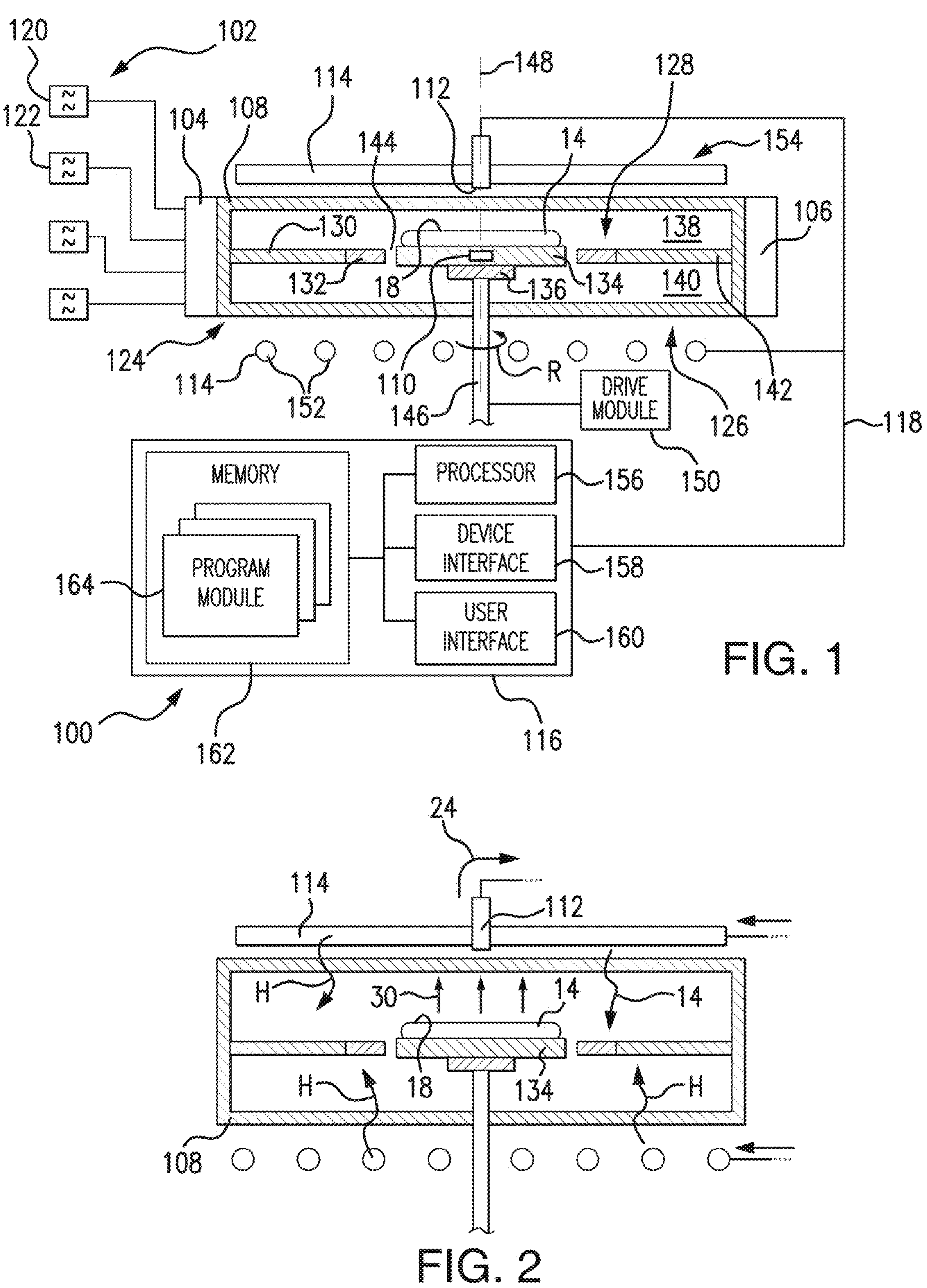
FIG. 1 is a schematic view of a semiconductor processing system in accordance with the present disclosure, showing a controller disposed in communication with a pyrometer and operatively connected to a heater element to control temperature of a substrate and layers deposited thereon supported within the reaction chamber using the pyrometer.
FIG. 2 is a schematic view of the semiconductor processing system of FIG. 1, showing the controller heating the substrate to a first layer forming temperature using the heater element according to a substrate surface temperature measurement provided by the pyrometer.

Reference will now be made to the drawings wherein like reference numerals identify similar structural features or aspects of the subject disclosure. For purposes of explanation and illustration, and not limitation, a partial view of an example of a semiconductor processing system in accordance with the disclosure is shown in FIG. 1 and is designated generally by reference character 100. Other embodiments of semiconductor processing systems, semiconductor device structures, and methods of forming structures, or aspects thereof, are provided in FIGS. 2-12, as will be described. The systems and methods of the present disclosure may be used to form film stack structures having alternating layer pairs of different compositions, such as nanosheet stacks of alternating silicon-germanium and silicon layers formed during the fabrication of semiconductor device structures having finFET or gate-all-around (GAA) architectures, though the present disclosure is not limited to any particular film or architecture in general.

Referring to FIG. 1, the semiconductor processing system 100 is shown. The semiconductor processing system 100 includes a gas delivery system 102, an injection flange 104, and an exhaust flange 106. The semiconductor processing system 100 also includes a reaction chamber 108, one or more thermocouple 110, and a pyrometer 112. The semiconductor processing system 100 further includes a heater element 114, a controller 116, and a wired or wireless link 118. Although the semiconductor processing system 100 is shown with a particular type of reaction chamber, e.g., a crossflow cold wall reactor, it is to be understood and appreciated that other types of reaction chambers and semiconductor processing systems may also benefit from the present disclosure.

The gas delivery system 102 includes a first layer precursor source 120 and a second layer precursor source 122. The first layer precursor source 120 is fluidly coupled to the reaction chamber 108 by the injection flange 104 and is configured to flow a first layer precursor 10 (shown in FIG. 3) to the injection flange 104. The second layer precursor source 122 is also fluidly coupled to the reaction chamber 108 by the injection flange 104 and is configured to flow a second layer precursor 12 (shown in FIG. 5) to the injection flange 104. In certain examples, the injection flange 104 may be configured to intermix two or more precursors prior to introduction of the precursors into the reaction chamber 108.

The reaction chamber 108 may be formed from a transmissive material, such as quartz, and has an injection end 124 and an opposite exhaust end 126. The exhaust flange 106 is connected to the exhaust end 126 of the reaction chamber 108 and is configured to fluidly couple the reaction chamber 108 to an exhaust source. The injection flange 104 is connected to the injection end 124 of the reaction chamber 108, couples the gas delivery system 102 to the reaction chamber 108, and is configured to intermix precursors received from the gas delivery system 102 to an interior 128 of the reaction chamber 108. A shelf 130, a one-piece ring 132, a susceptor 134, and a spider 136 are each arranged within the interior 128 of the reaction chamber 108.

The shelf 130 and the one-piece ring 132 are fixed within the interior 128 of the reaction chamber 108 and divide the interior 128 of the reaction chamber 108 into an upper chamber 138 and a lower chamber 140. The shelf 130 is arranged between the one-piece ring 132 and the injection flange 104 and may be formed from a transmissive material, such as quartz. The one-piece ring 132 is fixed between the shelf 130 and the exhaust flange 106 and may be formed from an opaque material, such as graphite. In certain examples, the shelf 130 may be a first shelf 130 and a second shelf 142 may be fixed within the reaction chamber 108 at a location between the one-piece ring 132 and the exhaust flange 106. The second shelf 142 may also be formed from a transmissive material, such as quartz.

The one-piece ring 132 has a one-piece ring aperture 144 extending therethrough coupling the upper chamber 138 with the lower chamber 140. The susceptor 134 is arranged within the one-piece ring aperture 144, may be formed from an opaque material such as graphite, and is fixed in rotation relative to the spider 136. The spider 136 may be formed from a transmissive material, such as quartz, connects the susceptor 134 to a shaft 146, and is fixed in rotation relative to the shaft 146. The shaft 146 is supported for rotation R about a rotation axis 148, extends through the wall of the reaction chamber 108, and is operably associated with a drive module 150 for rotating the susceptor 134. It is contemplated that the susceptor 134 be configured to support a substrate 14 thereon, e.g., a wafer formed from a semiconductor material such as silicon, during deposition of a layer pair onto a surface 18 of the substrate 14, e.g., a first layer 20 (shown in FIG. 3) and a second layer 22 (shown in FIG. 5).

The one or more thermocouple 110 is disposed in communication with the controller 116 via the wired or wireless link 118, is supported by the susceptor 134, and configured to generate a thermocouple signal indicative of local temperature within the reaction chamber 108, e.g., at the location of the one or more thermocouple 110. In this respect the one or more thermocouple 110 is thermally coupled to the surface 18 of the substrate 14 by both the thermal mass of the substrate 14 and a portion of the thermal mass of the susceptor 134. In certain examples, the one or more thermocouple 110 may be one of a thermocouple array arranged within the interior of the reaction chamber 108 and about the susceptor 134. As will be appreciated by those of skill in the art in view of the present disclosure, the thermocouple signal may therefore exhibit a delay corresponding the intervening thermal masses when temperature at the surface 18 of the substrate 14 changes, such as when mass flow rate of an exothermic reactant through the upper chamber 138 increases or decreases.

The pyrometer 112 is disposed in communication with the controller 116 via the wired or wireless link 118, is optically coupled to the reaction chamber 108, and is configured to determine temperature according to infrared electromagnetic radiation received by the pyrometer 112. The pyrometer 112 is further arranged outside of the reaction chamber 108 and is spaced apart from the susceptor 134 by the upper chamber 138 of the reaction chamber 108. In certain examples, the pyrometer 112 may overlay the susceptor 134. In accordance with certain examples, the pyrometer 112 may overlay (above) a center of the substrate 14 (shown in FIG. 3), e.g., such that rotation axis 148 intersects the pyrometer 112. In this respect the pyrometer 112 is arranged to receive infrared electromagnetic radiation 30 (shown in FIG. 2) emitted by the surface 18 (shown in FIG. 2) of the substrate 14 (shown in FIG. 2), infrared electromagnetic radiation 32 (shown in FIG. 3) emitted by the first layer 20 (shown in FIG. 3), and infrared electromagnetic radiation 34 (shown in FIG. 5) emitted by the second layer 22 (shown in FIG. 5) directly during the forming the forming of the layers. It is contemplated that the pyrometer 112 may be substantially orthogonal relative to the surface 18 of the substrate 14.

The heater element 114 is operatively associated with the controller 116, e.g., via the wired or wireless link 118 and thereby operatively associated with the pyrometer 112, and is radiantly coupled to the reaction chamber 108. The heater element 114 may be radiantly coupled to structures located within the reaction chamber 108. For example, the heater element 114 may be radiantly coupled to the one-piece ring 132, the susceptor 134, and/or the substrate 14 for heating the substrate 14, e.g., during deposition of the first layer 20 (shown in FIG. 3) and the second layer 22 (shown in FIG. 4) onto the substrate 14. In certain examples, the heater element 114 may be one of a plurality of heater elements arranged in a lower heater element array 152 located outside of the reaction chamber 108 and spaced apart from the susceptor 134 by the lower chamber 140. In accordance with certain examples, the heater element 114 may be one of a plurality of heater elements arranged in an upper heater element array 154 located outside of the reaction chamber 108 and spaced apart from the susceptor 134 by the upper chamber 138. The heater element 114 may include a heat lamp or an elongated filament-type heater element.

The controller 116 is disposed in communication with the thermocouple 110 and the pyrometer 112, is operatively connected to the heater element 114, and includes a processor 156, a device interface 158, a user interface 160, and a memory 162. The device interface 158 connects processor 156 with the wire or wireless link 118, and therethrough with the thermocouple 110 and the pyrometer 112. The device interface 158 also connects the controller 116 with the heater element 114 for operative connection thereto. The processor 156 is operably connected to the user interface 160 and is disposed in communication with the memory 162. The memory 162 includes a non-transitory machine-readable medium and has a plurality of program modules 164 recorded thereon with instructions that, when read by the processor 156, cause the processor to execute certain operations. Among those operations are operations of a method 200 (shown in FIG. 5) of forming a structure, as will be described.

As has been explained above, temperature of the substrate 14 may be controlled using the thermocouple 110, e.g., via the thermocouple temperature signal. While temperature control using the thermocouple 110 is generally satisfactory for its intended purpose, the thermal mass of the susceptor 134 and the substrate 14 may, in some reaction chamber, delay indication of temperature change at the surface 18 of the substrate 14 due to the intervening thermal mass of the substrate 14 and the susceptor 134, potentially causing heating compensation to lag temperature at the surface of a substrate during formation of layers thereon—particularly in deposition operations wherein the deposited layer is relatively thin, such as in nanosheet film stacks. To limit (or eliminate) such lag, the controller 116 is configured to control temperature of the substrate 14 using infrared electromagnetic radiation emitted by one or more of the surface 18 of the substrate 14, the first layer 20, and the second layer 22 using the pyrometer 112.

With reference to FIGS. 1-5, an example of a structure including the first layer 20 (shown in FIG. 3) and the second layer 22 (shown in FIG. 4) is shown being formed using pyrometer temperature control. As shown in FIG. 1, forming of the structure begins by providing the substrate 14 in the reaction chamber 108. In this respect the substrate 14 is positioned within the interior 128 of reaction chamber 108 and supported on the susceptor 134. It is contemplated that positioning the substrate 14 within the reaction chamber 108 radiantly couples the heater element 114 to the substrate 14. It is also contemplated that that positioning the substrate 14 on the susceptor 134 optically couples the pyrometer 112 to an upper surface 18 the substrate 14. In certain examples, the substrate 14 may be a blanket substrate. In accordance with certain examples, the substrate may be a patterned substrate. It is also contemplated that the substrate may include a wafer formed from a semiconductor material, such as silicon wafer.

As shown in FIG. 2, the substrate 14 is next thermally conditioned for the forming of the first layer 20 (shown in FIG. 3) onto the surface 18 of the substrate 14. Thermal conditioning of the substrate 14 is accomplished by receiving infrared electromagnetic radiation 30 emitted by the surface 18 of the substrate 14 at the pyrometer 112, determining surface temperature 24 of the substrate 14 using the infrared electromagnetic radiation 30 emitted by the surface 18 of the substrate 24, and comparing the surface temperature 24 to a predetermined first layer formation temperature. Based on the comparison of the surface temperature 24 to the predetermined first layer formation temperature limit, heating of the substrate 14 is increased or decreased using the heating element 114, and surface temperature 24 again compared to the predetermined first layer formation temperature limit. When the surface temperature 24 is within the predetermined first layer formation temperature limit, forming of the first layer 20 (shown in FIG. 3) begins. As will be appreciated by those of skill in the art in view of the present disclosure, direct observation of the surface 18 of the substrate 14 by the pyrometer 112 from above the surface 18 of the substrate 14 may provide greater accuracy in control of the surface temperature 24 provided by the pyrometer 110, e.g., via near (or actual) real time indication of temperature at the surface 18 of the substrate 14, by limiting delay that could otherwise be associated by relying of temperature change telegraphed through the thermal mass of the substrate 14 and the susceptor 134.

In certain examples, heating the surface 18 of substrate 14 may be accomplished by increasing or decreasing electrical power applied to the heater element 114. In accordance with certain examples, the surface temperature 24 determined by the pyrometer 112 and communicated to the controller 116 (shown in FIG. 1). In such examples the controller 116 may compare the surface temperature 24 to the predetermined first layer formation temperature limit and increase or decrease electrical power applied to the heater element 114 based on the comparison of the surface temperature 24 to the predetermined first layer formation temperature limit. The predetermined first layer formation temperature limit may in turn be received from another device, e.g., through the device interface 158 (shown in FIG. 1), or through the user interface 160 (shown in FIG. 1). It is also contemplated that the predetermined first layer temperature target may also be retrieved from the memory 162 (shown in FIG. 1) of the controller 116.

Figures 3, 4, 5:
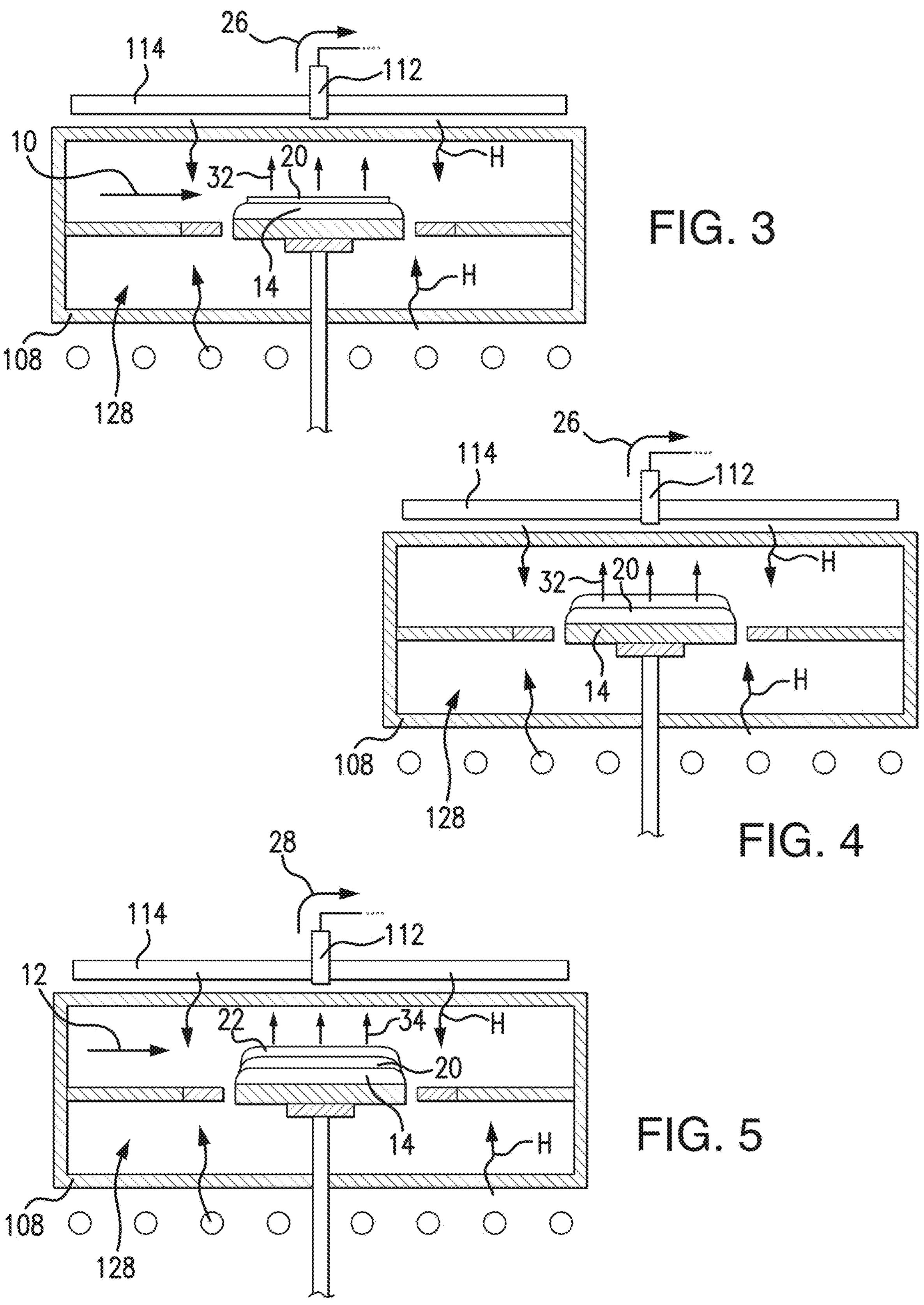
FIG. 3 is a schematic view of the semiconductor processing system of FIG. 1, showing the controller controlling temperature of the first layer during forming of the first layer using a first layer temperature provided by the pyrometer.
FIG. 4 is a schematic view of the semiconductor processing system of FIG. 1, showing the controller thermally conditioning the first layer according to a second layer forming temperature using the first layer temperature provided by the pyrometer.
FIG. 5 is a schematic view of the semiconductor processing system of FIG. 1, showing the controller controlling temperature of the second layer during forming of the second layer onto the first layer according to a second layer temperature provided by the pyrometer.

As shown in FIG. 3, the first layer 20 is next formed overlaying the substrate 14 by providing the first layer precursor 10 to the reaction chamber 108. In certain examples, pressure within the interior 128 of the reaction chamber 108 may be maintained within a predetermined first layer formation pressure limit during the forming of the first layer 20. In accordance with certain examples, temperature of the first layer 20 (and/or the substrate 14) may be maintained within the predetermined first layer formation temperature limit during the forming of the first layer 20. It is also contemplated that, in accordance with certain examples, the first layer 20 may be formed during a predetermined first layer formation interval.

As the first layer 20 forms overlaying the substrate 14, a first layer temperature 26 of the first layer 20 is controlled using infrared electromagnetic radiation 32 emitted by the first layer 20. In this respect it is contemplated that the infrared electromagnetic radiation 32 emitted by the first layer 20 during the forming of the first layer 20 be received at the pyrometer 112, that the first layer temperature 26 be determined using the infrared electromagnetic radiation 32 emitted by the first layer 20, and that the first layer temperature 26 be compared to the predetermined first layer formation temperature limit. Based on the comparison of the first layer temperature 26 to the predetermined first layer formation temperature limit, heating of the first layer 20 (and/or the substrate 14) is increased or decreased using the heating element 114, as appropriate based on the comparison, during the forming of the first layer 20. As above, direct observation of the first layer 20 by the pyrometer 112 from above the surface 18 of the substrate 14 may provide greater accuracy in control of the first layer temperature 26, e.g., through substantially real time indication of temperature change at the surface of the first layer 20 during forming of the first layer 20, by limiting delay that could otherwise be associated by relying of temperature change telegraphed through the thermal mass of the substrate 14 and the susceptor 134.

In certain examples, heating the first layer 20 may be accomplished by increasing or decreasing electrical power applied to the heater element 114. In accordance with certain examples, the first layer temperature 26 may be determined either by the pyrometer 112 and communicated to the controller 116 (shown in FIG. 1). In such examples the controller 116 may compare the first layer temperature 26 to the predetermined first layer formation temperature limit, and the controller 116 may further increase or decrease electrical power applied to the heater element 114 based on the comparison of the first layer temperature 26 to the predetermined first layer formation temperature limit.

As shown in FIG. 4, once the first layer 20 is formed, flow of the first layer precursor 10 to the reaction chamber 108 ceases and the first layer 20 is thermally conditioned for the forming of the second layer 22 (shown in FIG. 5) onto the first layer 20. Thermal conditioning of the first layer 20 is accomplished by receiving infrared electromagnetic radiation 32 emitted by the first layer 20 at the pyrometer 112, determining the first layer temperature 26 using the infrared electromagnetic radiation 32 emitted by the first layer 20, and comparing the first layer temperature 26 to a predetermined second layer formation temperature. Based on the comparison of the first layer temperature 26 to the predetermined second layer formation temperature limit, heating of the first layer 20 may be increased or decreased using the heating element 114, and the first layer temperature 26 may thereafter again be compared to the predetermined second layer formation temperature limit. Once the first layer temperature 26 is within the predetermined second layer formation temperature limit, forming of the second layer 22 begins. As above, direct observation of the first layer 20 by the pyrometer 112 from above the surface 18 of the substrate 14 may provide greater accuracy in control of the first layer temperature 26, e.g., through substantially real time indication of temperature change at the surface of the first layer 20, by limiting delay that could otherwise be associated by relying of temperature change telegraphed through the thermal mass of the substrate 14 and the susceptor 134.

In certain examples, thermal conditioning of the first layer 20 for the forming of the second layer 22 may be accomplished by increasing or decreasing electrical power applied to the heater element 114. In accordance with certain examples, the first layer temperature 26 may be determined either by the pyrometer 112 and communicated to the controller 116 (shown in FIG. 1). In such examples the controller 116 may compare the first layer temperature 26 to the predetermined second layer formation temperature limit, and the controller 116 may further increase or decrease electrical power applied to the heater element 114 based on the comparison of the first layer temperature 26 to the predetermined first layer formation temperature limit. The predetermined second layer formation temperature limit may in turn be received from another device, e.g., through the device interface 158 (shown in FIG. 1), or through the user interface 160 (shown in FIG. 1). It is also contemplated that the predetermined second layer temperature target may also be retrieved from the memory 162 (shown in FIG. 1) of the controller 116

As shown in FIG. 5, the second layer 22 is next formed onto the first layer 20 by providing the second layer precursor 12 to the reaction chamber 108. In certain examples, pressure within the interior 128 of the reaction chamber 108 may be maintained within a predetermined first layer formation pressure limit during the forming of the second layer 22. In accordance with certain examples, temperature of the second layer 22 may be maintained within the predetermined second layer formation temperature limit during the forming of the second layer 22. It is also contemplated that, in accordance with certain examples, that the second layer 22 be formed during a predetermined second layer formation interval.

As the second layer 22 forms onto the first layer 20 a second layer temperature 28 of the second layer 22 is controlled using infrared electromagnetic radiation 34 emitted by the second layer 22. In this respect it is contemplated that the infrared electromagnetic radiation 34 emitted by the second layer 22 during the forming of the second layer 22 be received at the pyrometer 112, that the second layer temperature 28 be determined using the infrared electromagnetic radiation 34 emitted by the second layer 20, and that the second layer temperature 28 be compared to the predetermined second layer formation temperature limit. Based on the comparison of the second layer temperature 28 to the predetermined second layer formation temperature limit, heating of the second layer 22 may be increased or decreased using the heating element 114, as appropriate based on the comparison, during the forming of the second layer 22. As above, direct observation of the second layer 22 during forming of the second layer 22 by the pyrometer 112 from above the second layer 22 may provide greater accuracy in control of the second layer temperature 28, e.g., through substantially real time indication of temperature change at the surface of the second layer 22 during forming of the second layer 22, by limiting delay that could otherwise be associated by relying of temperature change telegraphed through the thermal mass of the substrate 14 and the susceptor 134.

In certain examples, heating the second layer 22 may be accomplished by increasing or decreasing electrical power applied to the heater element 114. In accordance with certain examples, the second layer temperature 28 may be determined by the pyrometer 112 and communicated to the controller 116 (shown in FIG. 1). In such examples the controller 116 may compare the second layer temperature 28 to the predetermined second layer formation temperature limit, and the controller 116 may further increase or decrease electrical power applied to the heater element 114 based on the comparison of the second layer temperature 28 to the predetermined second layer formation temperature limit. Once the second layer 22 is formed flow of the second layer precursor 12 to the reaction chamber 108 ceases. The second layer 22 may thereafter be thermally conditioned using the pyrometer for the forming of one or more further layers overlaying the second layer 22, as appropriate for the intended application of resulting film stack. Although a certain number of layers are shown in FIGS. 2-5, it is to be understood and appreciated that examples of film stacks formed according to the present disclosure may have more than two layers and remain within the scope of the present disclosure.

Advantageously, as will be appreciated by those of skill in the art in view of the present disclosure, determining the first layer temperature 26 (shown in FIG. 3) and the second layer temperature 28 by the pyrometer 112 can limit delay in reporting and compensating for temperature change during deposition of the first layer 20 and the second layer 22 otherwise entailed by controlling temperature using the thermocouple 110. Without being bound by a particular theory, it is believed that the delay associated with communicating temperature change at first layer 20 and/or the second layer 22 through the substrate 14 and the susceptor 134 when controlling temperature using the thermocouple 110 may, during the formation of some structures, impart layer-to-layer thickness variation greater than otherwise possible when temperature is controlled using the pyrometer 112. While such variation is typically relatively small, the real time temperature reporting available from the pyrometer 112 may limit layer-to-layer variation, particularly in substrates that exhibit relatively low emissivity change during heating such as unpatterned blanket substrates, allowing the reaction chamber 108 to form structures intolerant of such variation, as may be the case with semiconductor device structures formed from nanosheet stacks such as semiconductor device structures having finFET or GAA architectures.

In certain examples, the first layer precursor 10 may include one or more of dichlorosilane ($H_2SiCl_2$), silane ($SiH_4$), germane ($GeH_4$), and hydrochloric acid (HCl). In accordance with certain examples, the predetermined first layer formation pressure may be between about 2 torr and about 80 torr, or between about 4 torr and about 60 torr, or between about 5 torr and about 40 torr. It is contemplated that, in accordance with certain examples, the predetermined first layer formation interval may be between about 10 seconds and about 50 seconds, or between about 10 seconds and about 40 seconds, or between about 16 and about 26 seconds. It is also contemplated that, in accordance with certain examples, the predetermined first layer formation temperature may be between about 500° C. and about 750° C., or between about 600° C. and about 700° ° C., or between about 620° C. and about 680° C. Forming the first layer 20 under these process conditions allows the first layer 20 to be formed as a nanosheet.

In certain examples, the second layer precursor 12 may include one or more of silane ($SiH_4$), dichlorosilane ($H_2SiCl_2$), disilane ($Si_2H_6$), and trisilane ($Si_3H_8$). In accordance with certain examples, the predetermined second layer formation pressure may be between about 2 torr and about 80 torr, or between about 4 torr and about 60 torr, or between about 5 torr and about 40 torr. It is contemplated that, in accordance with certain examples, the predetermined second layer formation interval may be between about 10 seconds and about 50 seconds, or between about 14 seconds and about 40 seconds, or between about 16 seconds and about 26 seconds. It is also contemplated that, in accordance with certain examples, that the predetermined second layer formation temperature may be between about 600° C. and about 800° C., or between about 600° C. and about 750° C., or between about 640° C. and about 700° C. Forming the second layer 22 under these process conditions allows the second layer 22 to be formed as a nanosheet. In certain examples, forming the second layer 22 as a nanosheet while controlling temperature using the pyrometer 112 allows the within wafer thickness variation of the second layer 22 to be less than one-half of that when the thermocouple 110 is employed for temperature control.

With reference to FIGS. 6-10, the method 200 of forming a structure overlaying a substrate, e.g., the first layer 20 (shown in FIG. 3) and the second layer 22 (shown in FIG. 5) overlaying the substrate 14 (shown in FIG. 2), is shown. As shown with box 210, the substrate is first provided (supported) within a reaction chamber, e.g., the reaction chamber 108 (shown in FIG. 1). A pyrometer, e.g., the pyrometer 112 (shown in FIG. 1), is then optically coupled to a surface of the substrate, as shown with box 212. A heater element, e.g., the heater element 114 (shown in FIG. 1), is thereafter radially coupled to the substrate and the substrate thermally conditioned for forming a first layer on the substrate, as shown with box 214 and box 220. The first layer is thereafter formed on the substrate, as shown with box 240. Once the first layer is formed on the substrate the first layer (and/or the substrate) is thermally conditioned for forming the second layer onto the first layer, as shown with box 260, and the second layer is thereafter formed onto the first layer, as shown with box 280.

In certain examples thermally conditioning 220 the substrate for the forming of the first layer may include controlling temperature of the substrate, e.g., of surface 18 (shown in FIG. 1), using infrared electromagnetic radiation emitted by the substrate, as shown with box 230. In accordance with certain examples, forming the first layer on the substrate may include controlling temperature of the first layer (and/or the underlying substrate) using electromagnetic radiation emitted by the first layer, as shown with box 250. It is contemplated that thermally conditioning 260 the substrate for the forming of the second layer may include controlling temperature of the first layer (and/or the underlying substrate) using infrared electromagnetic radiation emitted by the first layer, as shown with box 270. It also contemplated that forming 280 the second layer onto the first layer may include controlling temperature of the second layer during the forming of the second layer using electromagnetic radiation emitted by the second layer, as shown with box 290. In further examples, the first layer and the second layer may be a first pair, and one or more second layer pair may be formed onto the first layer pair, e.g., to form a nanosheet film stack for semiconductor device structures having three-dimensional architectures, such as finFET architectures or GAA architectures, as shown with arrow 216.

Figure 7:
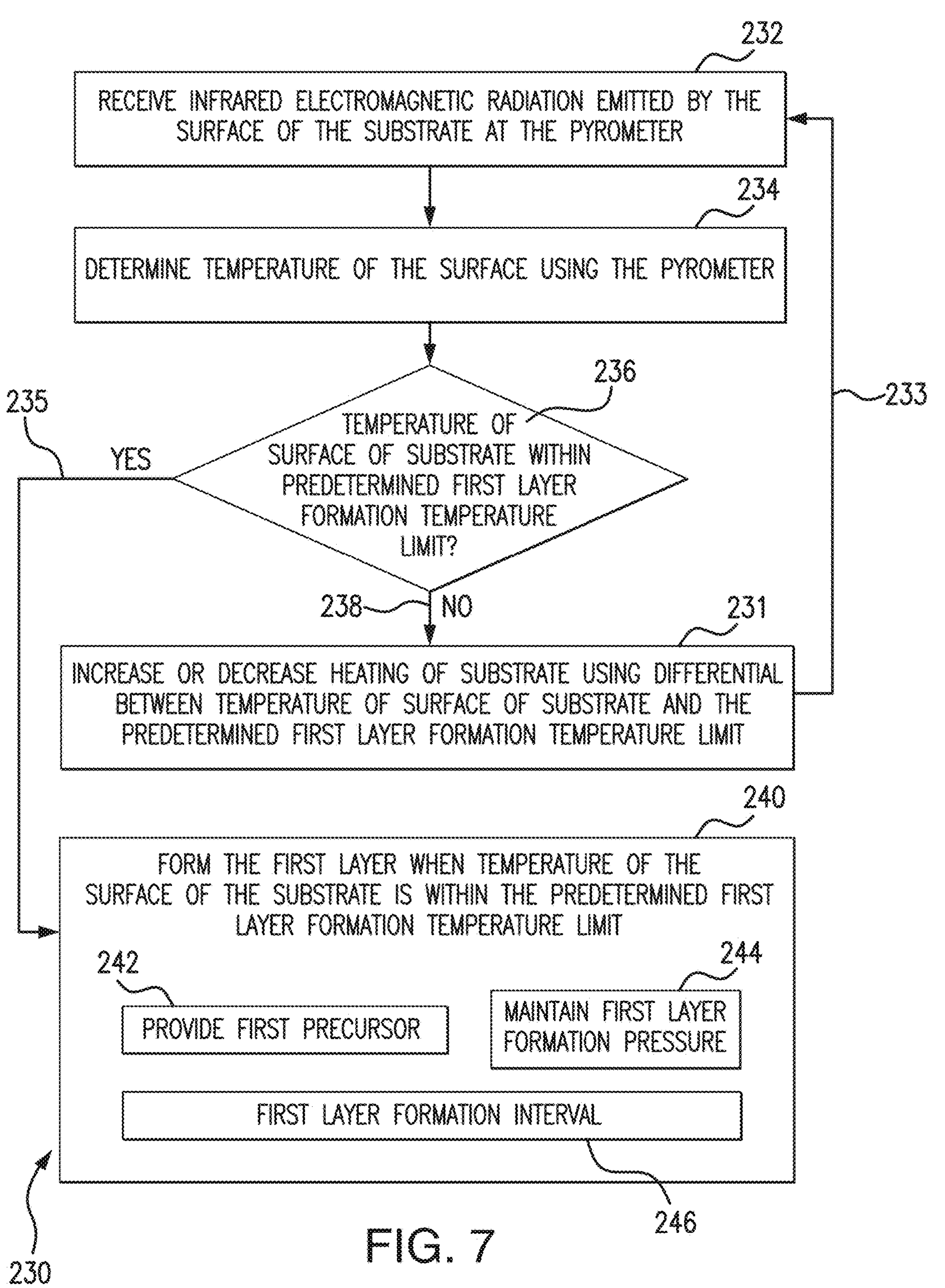
FIG. 7 is a block diagram of a portion of the method of FIG. 6, showing operations for thermally conditioning a substrate according to a first layer forming temperature prior to forming a first layer on the substrate using infrared electromagnetic radiation emitted by an upper surface of the substrate and received by a pyrometer.

As shown in FIG. 7, controlling 230 temperature of the substrate during thermal conditioning of the substrate for formation of the first layer may include receiving infrared electromagnetic radiation emitted by a surface of the substrate at the pyrometer, e.g., the surface 18 (shown in FIG. 2), as shown with box 232. Surface temperature of the substrate may be determined using the infrared electromagnetic radiation emitted by the surface of the substrate and received by the pyrometer and compared to a predetermined first layer formation temperature limit, as shown with box 234 and box 236. When the determined surface temperature is outside the predetermined first layer formation temperature limit, heating of the substrate may be increased or decreased according to differential between the determined surface temperature and predetermined first layer formation temperature limit, e.g., by increasing (or decreasing) electrical power applied to the one or more heater element 114 (shown in FIG. 1), as shown with arrow 238 and box 231, and temperature rechecked, as shown with arrow 233. When the determined surface temperature is within the predetermined first layer formation temperature limit, forming of the first layer may begin, as shown with arrow 235 and box 240. Forming the first layer may include providing a first layer precursor to the reaction chamber, e.g., the first layer precursor 10 (shown in FIG. 1), as shown with box 242. Forming the first layer may include maintaining pressure within the reaction chamber to within a predetermined first layer formation pressure, as shown with box 244. Forming the first layer may include forming the first layer during a predetermined first layer formation interval, as shown with box 246.

Figure 8:
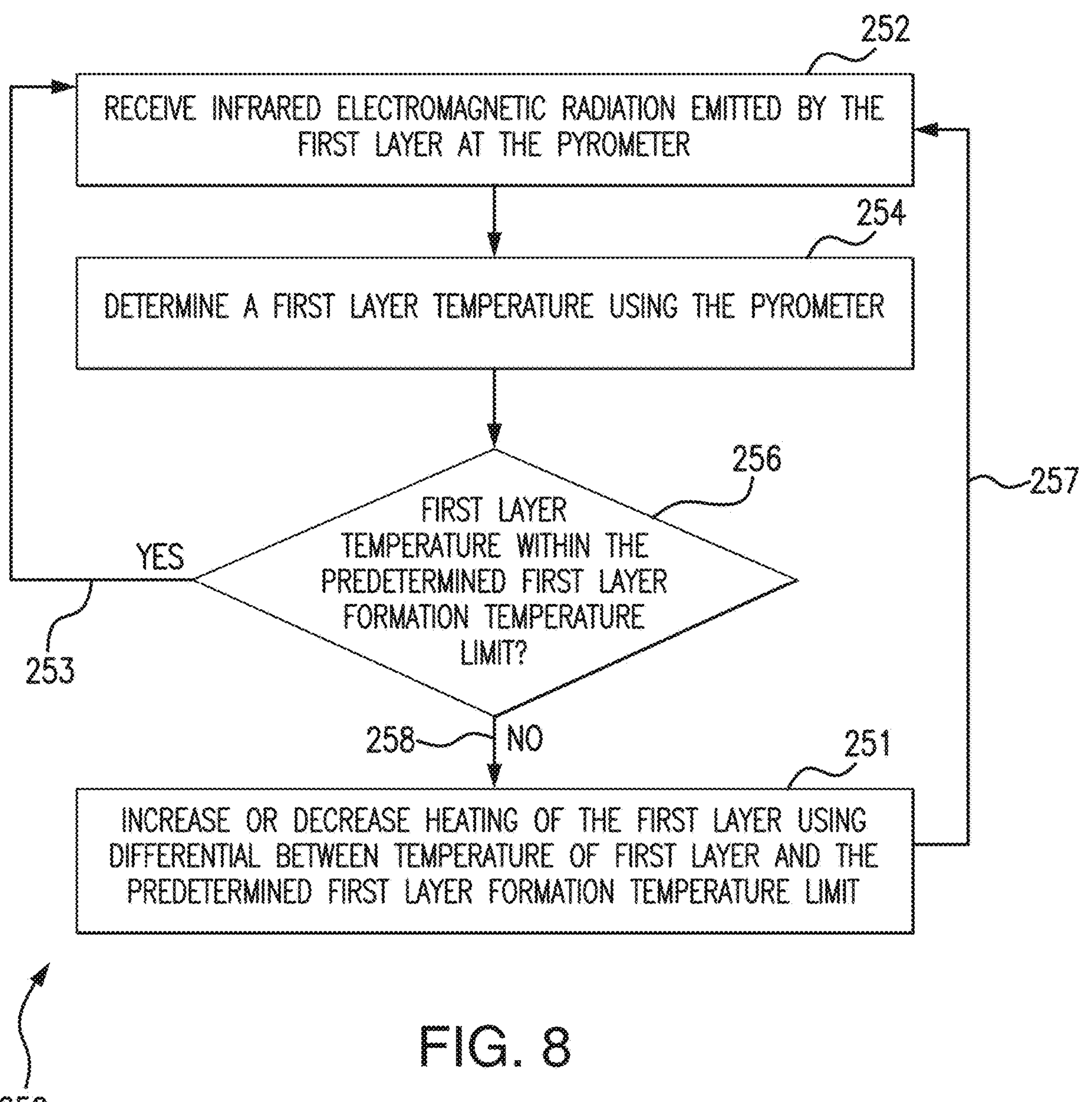
FIG. 8 is a block diagram of a portion of the method of FIG. 6, showing operations for controlling temperature of a first layer during forming of the first layer on the substrate using infrared electromagnetic radiation emitted by the first layer and received by the pyrometer.

As shown in FIG. 8, controlling 250 temperature of the first layer during forming the first layer may include receiving infrared electromagnetic radiation emitted by the first layer at the pyrometer during the forming of the first layer, e.g., the infrared electromagnetic radiation 32 (shown in FIG. 3), as shown with box 252. A first layer temperature may be determined using the infrared electromagnetic radiation received by the pyrometer, e.g., the first layer temperature 26 (shown in FIG. 3), and the determined first layer temperature compared to the predetermined first layer temperature limit, as shown with box 254 and 256. When the determined first layer temperature is outside of the predetermined first layer formation temperature limit hearing of the first layer (and/or the underlying substrate) may be increased or decreased, e.g., using the heater element 114 (shown in FIG. 1), as shown with arrow 258 and box 251. The first layer temperature may thereafter be checked, compared again with the predetermined first layer formation temperature limit, and heating of the first layer (and/or the underlying substrate) further adjusted, as appropriate, as shown with arrow 257. When the determined first layer temperature is within the predetermined first layer formation temperature limit the first layer temperature may be monitored by the pyrometer, e.g., by iteratively determining first layer temperature using infrared electromagnetic radiation received by the pyrometer, as shown with arrow 253.

Figure 9:
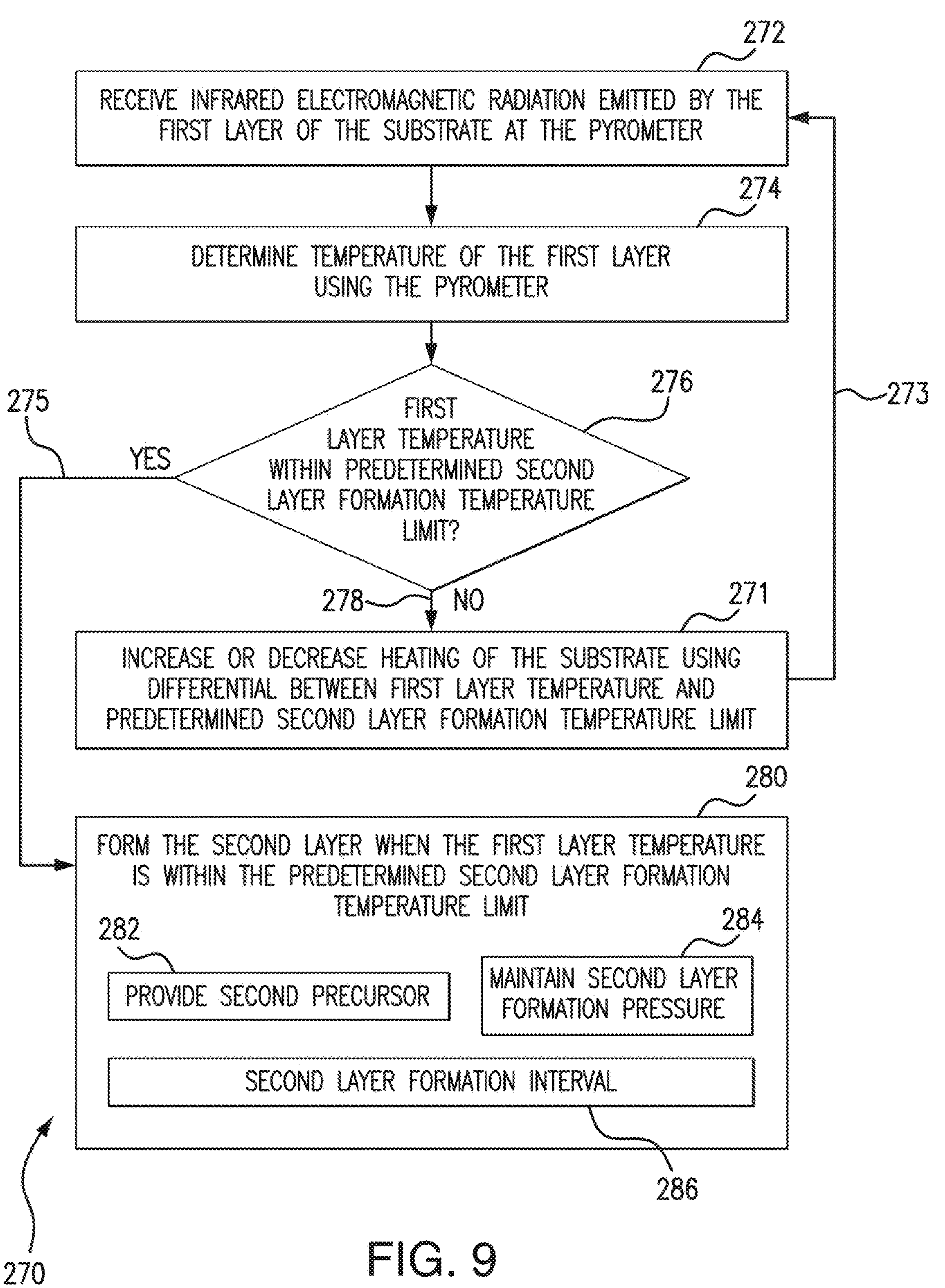
FIG. 9 is a block diagram of a portion of the method of FIG. 6, showing operations for thermally conditioning the first layer prior to forming a second layer onto the first layer using infrared electromagnetic radiation emitted by the first layer and received by the pyrometer.

As shown in FIG. 9, controlling 270 temperature of the substrate to thermally condition the substrate for forming the second layer onto the first layer may include receiving infrared electromagnetic radiation from the first layer at the pyrometer once the forming of the first layer is substantially complete, as shown with box 272. Temperature of the substrate may be determined using the infrared electromagnetic radiation emitted by the first layer and received by the pyrometer and the first layer temperature compared to a predetermined second layer temperature limit, as shown with box 274 and box 276. When the determined first layer temperature is outside the predetermined second layer formation temperature limit heating of the first layer (and/or the underlying substrate) may be increased or decreased according to differential between the determined first layer temperature and predetermined second layer formation temperature limit, e.g., by increasing (or decreasing) electrical power applied to the one or more heater element 114 (shown in FIG. 1), as shown with arrow 278 and box 271, and temperature thereafter rechecked, as shown with arrow 273. When the determined first layer temperature is within the predetermined second layer formation temperature limit, forming 280 of the second layer may begin, as shown with arrow 275 and box 280. Forming 280 the second layer may include providing a second layer precursor to the reaction chamber, e.g., the second layer precursor 12 (shown in FIG. 1), as shown with box 282. Forming 280 the second layer may include maintaining pressure within the reaction chamber to within a predetermined second layer formation pressure, as shown with box 284. Forming 280 the second layer may include forming the second layer during a predetermined second layer formation interval, as shown with box 286.

Figure 10:
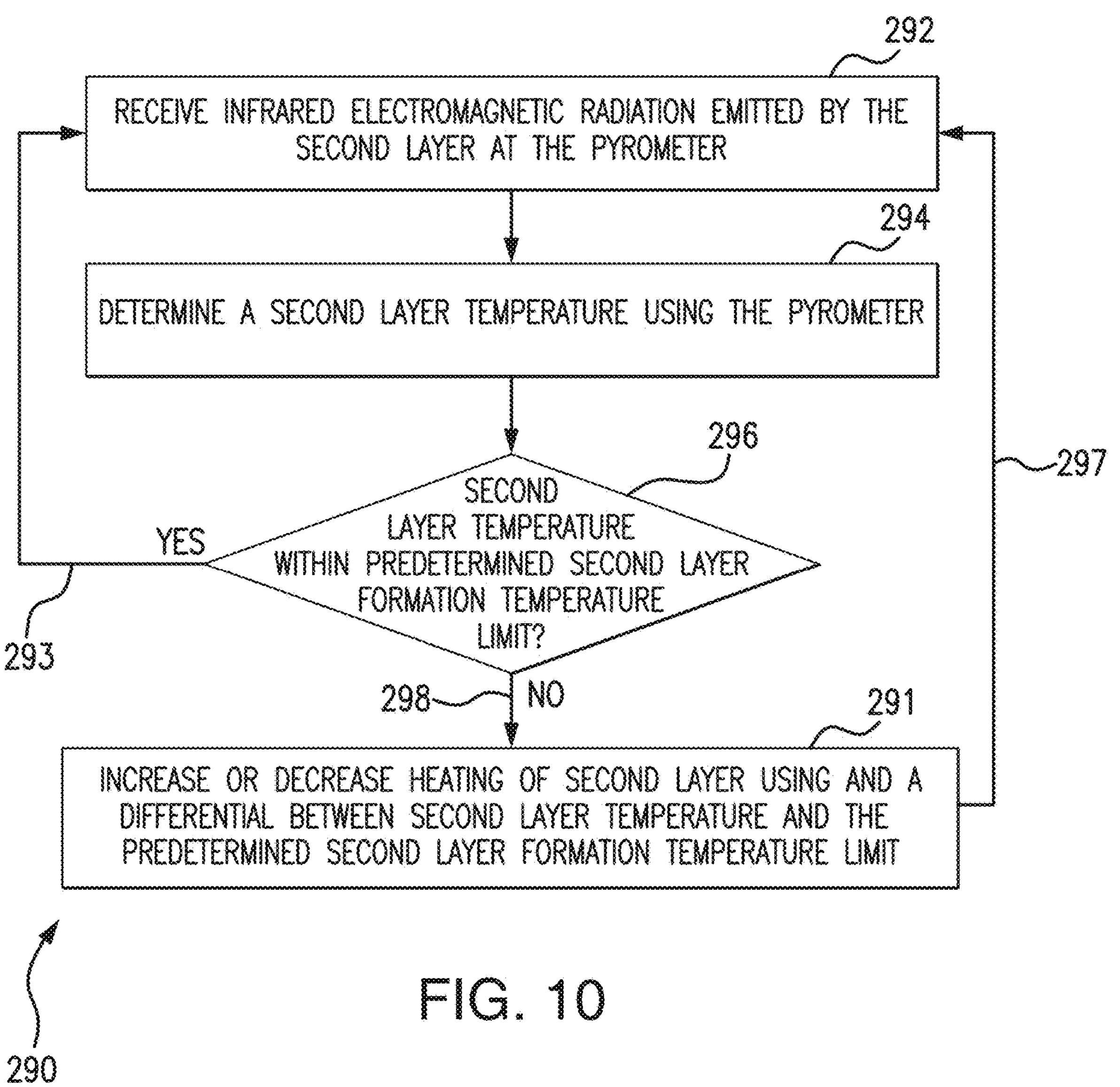
FIG. 10 is a block diagram of a portion of the method of FIG. 6, showing operations for controlling temperature of a second layer using electromagnetic radiation emitted by the second layer and received by the pyrometer during the forming of the second layer.

As shown in FIG. 10, controlling 290 temperature of the substrate during forming 280 of the second layer may include receiving infrared electromagnetic radiation from the second layer at the pyrometer, e.g., the infrared electromagnetic radiation 34 (shown in FIG. 5) from the second layer 22 (shown in FIG. 5), as shown with box 292. A second layer temperature may be determined using the infrared electromagnetic radiation emitted by the second layer and received by the pyrometer, e.g., the second layer temperature 28 (shown in FIG. 5), and the determined second layer temperature compared to the predetermined second layer formation temperature limit, as shown with box 294 and box 296. It is contemplated that of the second layer (and/or underlying substrate) may be increased or decreased, e.g., using the heater element 114 (shown in FIG. 1), when the determined second layer temperature is outside of the predetermined second layer formation temperature limit, as shown with arrow 298 and box 291. The second layer temperature may thereafter be again determined, compared with the predetermined second layer formation temperature limit, and heating of the second layer further adjusted, as appropriate, as shown with arrow 297. It is also contemplated that the second layer temperature may be monitored by the pyrometer, e.g., by iteratively determining first layer temperature using infrared electromagnetic radiation received by the pyrometer, when the second layer temperature is within the predetermined second layer formation temperature limit, as shown with arrow 293.

With reference to FIG. 11, an example of a structure, e.g., the semiconductor device structure 300, formed using the method 200 (shown in FIG. 6) is shown. The semiconductor device structure 300 includes the substrate 14, a first layer pair 302, a second layer pair 304, and one or more third layer pair 306 formed using the method 200 (shown in FIG. 6). In this respect the first layer pair 302 includes a first silicon-germanium layer 308 overlaying the substrate 14 and a first silicon layer 310 formed onto the first silicon germanium layer 308, the second layer pair 304 includes a second silicon-germanium layer 312 formed onto the first silicon layer 310 and a second silicon layer 314 formed onto the second silicon germanium layer 312, and the third layer pair 306 includes a third silicon-germanium layer 316 formed onto the second silicon layer 314 and a third silicon layer 318 formed onto the third silicon germanium layer 316. A fourth silicon-germanium layer 320 is thereafter formed on the third silicon layer 318.

In certain examples, the semiconductor device structure 300 be a nanosheet stack for a semiconductor device structure having a finFET of a GAA architecture. For example, layers of the first layer pair 302 and the second layer pair 304 may having thicknesses that are less than 50 nanometers, or less than 25 nanometers, or less than 10 nanometers, or even less than 5 nanometers. Layers of the first layer pair 302 and the second layer pair 304 may have thicknesses that are between about 50 nanometers and about 5 nanometers. In accordance with certain examples, each of the layers may be formed sequentially within the reaction chamber 108 (shown in FIG. 1), i.e., without removal of the substrate 14 from the reaction chamber 108. It is contemplated that a semiconductor device structure having a finFET or GAA architecture may thereafter be formed including one or more of the layer pairs, e.g., the first layer pair 302, the second layer pair 304, and/or the third layer pair 306. Examples of suitable finFET devices include those shown and described in U.S. Pat. No. 8,895,395 to Kerber et al., issued on Nov. 25, 2014, the contents of which is incorporated herein by reference in its entirety. Examples of suitable GAA semiconductor device structures include those shown and described in U.S. Pat. No. 8,969,934 to Cheng et al., issued on Mar. 3, 2015, the contents of which is incorporated herein by reference in its entirety.

With reference to FIG. 12, a chart 400 including graphs 402-408 of layer thicknesses is shown of the semiconductor device structure 300 (shown in FIG. 11) in relation to another semiconductor device structure formed using thermocouple control is shown. Graphs 402 and 406 show layer-to-layer variation within the semiconductor device structure 300 formed using pyrometer control, e.g., using the pyrometer 112 (shown in FIG. 1). Graphs 404 and 408 shown layer-to-layer thickness variation within semiconductor device structures formed using thermocouple control, e.g., the thermocouple 110 (shown in FIG. 1).

As shown comparatively in graphs 402 and 404, mean layer-to-layer thickness variation among silicon-germanium layers 308, 312, 316, and 320 within the semiconductor device structure 300 (shown in FIG. 11) may be on the order of about 25% that of otherwise identical silicon-germanium layers A, C, E, and G of the semiconductor device structure formed using thermocouple control. As shown comparatively in graphs 406 and 408, mean layer-to-layer thickness variation among silicon layers 310, 314, and 318 of the semiconductor device structure 300 formed using pyrometer control may also be on the order of about 25% that of otherwise identical silicon layers B, D, and F of the semiconductor device structure formed using thermocouple control. As will be appreciated by those of skill in the art in view of the present, limiting layer-to-layer thickness variation using pyrometer control may therefore improve the reliability and/or yield of semiconductor device structures, such as semiconductor device structures having finFET or GAA architectures, in relation to otherwise identical semiconductor device structures formed using thermocouple control. As will also be appreciated by those of skill in the art in view of the present disclosure, one or more layers within the semiconductor device structure 300 also be different than one or more other layer in the film stack, such as by targeting a different layer thickness, and remain within the scope of the present disclosure. Although a certain number of layer pairs are shown in FIG. 12, it is to be understood and appreciated that structures may have fewer layer pairs or more layer pairs and remain within the scope of the present disclosure.

The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

PARTS LIST

10 First Layer Precursor
12 Second Layer Precursor
14 Substrate
16 Layer Pair
18 Surface
20 First Layer
22 Second Layer
24 Surface Temperature
26 First Layer Temperature
28 Second Layer Temperature
30 Infrared Electromagnetic Radiation
32 Infrared Electromagnetic Radiation
34 Infrared Electromagnetic Radiation
100 Semiconductor Processing System
102 Gas Delivery System
104 Injection Flange
106 Exhaust Flange
108 Reaction Chamber
110 Thermocouple
112 Pyrometer
114 Heater element
116 Controller
118 Wired or Wireless Link
120 First Precursor Source
122 Second Precursor Source
124 Injection End
126 Exhaust End
128 Interior
130 Shelf
132 One-Piece Ring
134 Susceptor
136 Spider
138 Upper Chamber
140 Lower Chamber
142 Second Shelf
144 One-Piece Ring Aperture
146 Shaft
148 Rotation Axis
150 Drive Module
152 Lower Heater element Array
154 Upper Heater element Array
156 Processor
158 Device Interface
160 User Interface
162 Memory
164 Program Module
200 Method
210 Box
212 Box
214 Box
216 Arrow
220 Box
230 Box
231 Box
232 Box
233 Arrow
234 Box
235 Arrow
236 Box
238 Arrow
240 Box
242 Box
244 Box
246 Box
250 Box
25 Box
252 Box
253 Arrow
254 Box
256 Box
257 Arrow
258 Arrow
259 Arrow
260 Box
270 Box
27 Box
272 Box
273 Arrow
274 Box
275 Arrow
276 Box 278 Arrow
280 Box
282 Box
284 Box
286 Box
291 Box
292 Box
293 Arrow
294 Box
295 Box
296 Box
298 Arrow
299 Arrow
300 Semiconductor Device Structure
302 First Layer Pair
304 Second Layer Pair
306 Third Layer Pair
308 First Silicon-Germanium Layer
310 First Silicon Layer
312 Second Silicon-Germanium Layer
314 Second Silicon Layer
316 Third Silicon-Germanium Layer
318 Third Silicon Layer
400 Chart
402 Graph
404 Graph
406 Graph
408 Graph

The invention claimed is:

1. A semiconductor processing system, comprising:
- a reaction chamber configured for forming a structure on a substrate;
- a pyrometer optically coupled to the substrate;
- a heater element radiantly coupled to the substrate; and
- a controller disposed in communication with the pyrometer and operatively connected to the heater element, the controller responsive to instructions recorded on a non-transitory machine-readable memory to:
  - form a first layer overlaying the substrate;
  - control a temperature of the substrate using infrared electromagnetic radiation emitted by the first layer during the forming of the first layer;
  - form a second layer onto the first layer; and
  - control the temperature of the substrate using infrared electromagnetic radiation emitted by the second layer during the forming of the second layer.

2. The system of claim 1, wherein the instructions further cause the controller to:
- determine a first layer temperature using the infrared electromagnetic radiation received from the first layer at the pyrometer;
- compare the first layer temperature to a predetermined first layer formation temperature limit; and
- increase or decrease heating of the first layer in response to the first layer temperature being outside of the predetermined first layer formation temperature limit.

3. The system of claim 1, wherein the instructions further cause the controller to:
- determine a second layer temperature using the infrared electromagnetic radiation received from the second layer at the pyrometer;
- compare the second layer temperature to a predetermined second layer formation temperature limit; and
- increase or decrease heating of the second layer in response to the second layer temperature being outside of the predetermined second layer formation temperature limit.

4. The system of claim 1, wherein the pyrometer is optically coupled to the first layer during the forming of the first layer, and wherein the pyrometer is optically coupled to the second layer during the forming of the second layer.

5. The system of claim 1, further comprising a thermocouple disposed on a side of the substrate opposite the pyrometer.

6. The system of claim 5, wherein the thermocouple is disposed within the reaction chamber.

7. The system of claim 1, wherein the pyrometer is disposed outside of the reaction chamber.

8. The system of claim 1, wherein the instructions further cause the controller to thermally condition the substrate prior to forming the first layer overlaying the substrate.

9. The system of claim 8, wherein to thermally condition the substrate, the instructions further cause the controller to:
- determine a substrate surface temperature using infrared electromagnetic radiation received from the substrate at the pyrometer;
- compare the substrate surface temperature to a predetermined first layer formation temperature limit;
- increase or decrease heating of the substrate in response to the substrate surface temperature being outside of the predetermined first layer formation temperature limit; and
- begin formation of the first layer on the substrate in response to the substrate surface temperature being within the predetermined first layer formation temperature limit.

10. The system of claim 1, wherein the instructions further cause the controller to thermally condition the first layer prior to forming the second layer onto the first layer.

11. The system of claim 10, wherein to thermally condition the first layer, the instructions further cause the controller to:
- determine a first layer temperature using infrared electromagnetic radiation received from the first layer at the pyrometer;
- compare the first layer temperature to a predetermined second layer formation temperature limit;
- increase or decrease heating of the first layer in response to the first layer temperature being outside of the predetermined second layer formation temperature limit; and
- begin formation of the second layer onto the first layer in response to the first layer temperature being within the predetermined second layer formation temperature limit.

12. The system of claim 1, further comprising a first layer precursor source fluidly coupled to the reaction chamber.

13. The system of claim 12, wherein the instructions further cause the controller to:
- provide a first layer precursor to the reaction chamber comprising one or more of dichlorosilane ($H_2SiCl_2$), silane ($SiH_4$), hydrochloric acid (HCl), and germane ($GeH_4$).

14. The system of claim 1, wherein to form the first layer, the instructions further cause the controller to maintain a first layer formation pressure within the reaction chamber between about 2 torr and about 80 torr.

15. The system of claim 1, wherein to form the first layer, the instructions further cause the controller to maintain the first layer within a predetermined first layer formation temperature limit between about 620° C. and about 680° C.

16. The system of claim 1, wherein the instructions further cause the controller to form the first layer during a first layer formation interval between about 10 seconds and about 50 seconds.

17. The system of claim 1, further comprising a second layer precursor source fluidly coupled to the reaction chamber.

18. The system of claim 17, wherein the instructions further cause the controller to:

provide a second layer precursor to the reaction chamber comprising one or more of silane ($SiH_4$), dichlorosilane ($H_2SiCl_2$), disilane ($Si_2H_6$), and trisilane ($Si_3H_8$).

19. The system of claim 1, wherein to form the second layer, the instructions further cause the controller to maintain a second layer formation pressure within the reaction chamber between about 2 torr and about 80 torr.

20. The system of claim 1, wherein to form the second layer, the instructions further cause the controller to maintain the second layer within a predetermined second layer formation temperature limit between about 600° C. and about 800° C.

* * * * *